(12) United States Patent
Terhune, IV

(10) Patent No.: US 8,430,677 B2
(45) Date of Patent: Apr. 30, 2013

(54) ELECTRICAL CONNECTOR INCORPORATED WITH CIRCUIT BOARD FACILITATING INTERCONNECTION

(75) Inventor: Albert Harvey Terhune, IV, Chandler, AZ (US)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 73 days.

(21) Appl. No.: 12/931,591

(22) Filed: Feb. 3, 2011

(65) Prior Publication Data
US 2012/0202361 A1 Aug. 9, 2012

(51) Int. Cl.
*H01R 12/00* (2006.01)

(52) U.S. Cl.
USPC .......................................................... 439/66

(58) Field of Classification Search ............ 439/67, 439/66, 64, 331, 73, 326, 630; 361/761, 361/764, 749
See application file for complete search history.

(56) References Cited

U.S. PATENT DOCUMENTS

| | | | | |
|---|---|---|---|---|
| 5,425,651 A * | 6/1995 | Thrush et al. | | 439/326 |
| 5,432,679 A * | 7/1995 | Grabbe | | 361/769 |
| 5,790,377 A * | 8/1998 | Schreiber et al. | | 361/704 |
| 5,895,281 A * | 4/1999 | Rothenberger | | 439/326 |
| 6,303,988 B1 * | 10/2001 | Crumly | | 257/690 |
| 6,454,587 B1 * | 9/2002 | Malone | | 439/331 |
| 6,536,872 B2 * | 3/2003 | Goin et al. | | 347/50 |
| 7,004,762 B2 * | 2/2006 | Okitsu | | 439/73 |
| 7,165,977 B2 * | 1/2007 | Jiang et al. | | 439/67 |
| 7,462,035 B2 * | 12/2008 | Lee et al. | | 439/37 |
| 7,819,693 B2 | 10/2010 | Polnyi | | |
| 8,164,915 B2 * | 4/2012 | Niemax | | 361/761 |
| 2003/0232517 A1 * | 12/2003 | Liu et al. | | 439/67 |
| 2004/0140548 A1 | 7/2004 | Chen et al. | | |
| 2006/0228913 A1 * | 10/2006 | Jiang et al. | | 439/67 |
| 2008/0176442 A1 * | 7/2008 | Kuo et al. | | 439/494 |
| 2010/0099275 A1 * | 4/2010 | Wahlberg | | 439/64 |

* cited by examiner

*Primary Examiner* — Alexander Gilman

(74) *Attorney, Agent, or Firm* — Wei Te Chung; Ming-Chieh Chang

(57) ABSTRACT

An electrical connector (1) comprises a frame (11) having a supporting base (111) and a flat circuit board (13) laid on the supporting base (111). The flat circuit board (13) has an array of conductive pads (131) on an upper surface thereof for electrically connecting with an electronic package (2) and a plurality of golden fingers (133) aligned on at least one end thereof. An electrical connector assembly (100) comprises the electrical connector (1) and an electronic package (2) assembled to the electrical connector (1).

20 Claims, 4 Drawing Sheets

ELECTRICAL CONNECTOR INCORPORATED WITH CIRCUIT BOARD FACILITATING INTERCONNECTION

BACKGROUND OF THE INVENTION

1. Field of the Invention

The present invention relates to an electrical connector incorporated with circuit board featured with an array of conductive pads to facilitate interconnection with an electronic package seated therein. The electrical connector further features an interface interlinked with motherboard through golden fingers distributed along edges.

2. Description of the Prior Art

A conventional electrical connector for electrically connecting an electronic package with a circuit substrate disclosed in U.S. Pat. No. 7,819,693 issued to Polnyi on Oct. 26, 2010 includes an insulative housing and a plurality of terminals received in the insulative housing. The terminals are formed from metal and, extend between the electronic package and the circuit substrate to electrically connect them. Each terminal must have proper height dimensioned to ensure enough resilience to apply fine connection, thereby it is difficult to decrease the height of the electrical connector. In addition, the electrical connector further has a retaining machine including a stiffener surrounding the insulative housing and a clip mounted to the stiffener for retaining the electronic package, so height of the electrical connector is comparably bulky. Overall, the electrical connector can not meet trend of lower profile and miniaturization.

In view of the above, an improved electrical connector that overcomes the above-mentioned disadvantages is desired.

SUMMARY OF THE INVENTION

Accordingly, an object of the present invention is to provide an electrical connector with flat circuit board applying electrical connection.

To fulfill the above-mentioned object, an electrical connector comprising a frame including a supporting base and a circuit board disposed on the supporting base. The circuit board includes an array of conductive pads and at least an interface deployed along an edge thereof. An electrical connector assembly comprises the electrical connector and an electronic package assembled to the electrical connector.

Other objects, advantages and novel features of the invention will become more apparent from the following detailed description when taken in conjunction with the accompanying drawings.

DETAILED DESCRIPTION OF THE PREFERRED EMBODIMENT OF THE INVENTION

Reference will now be made to the drawings to describe the present invention in detail.

Figure 1:
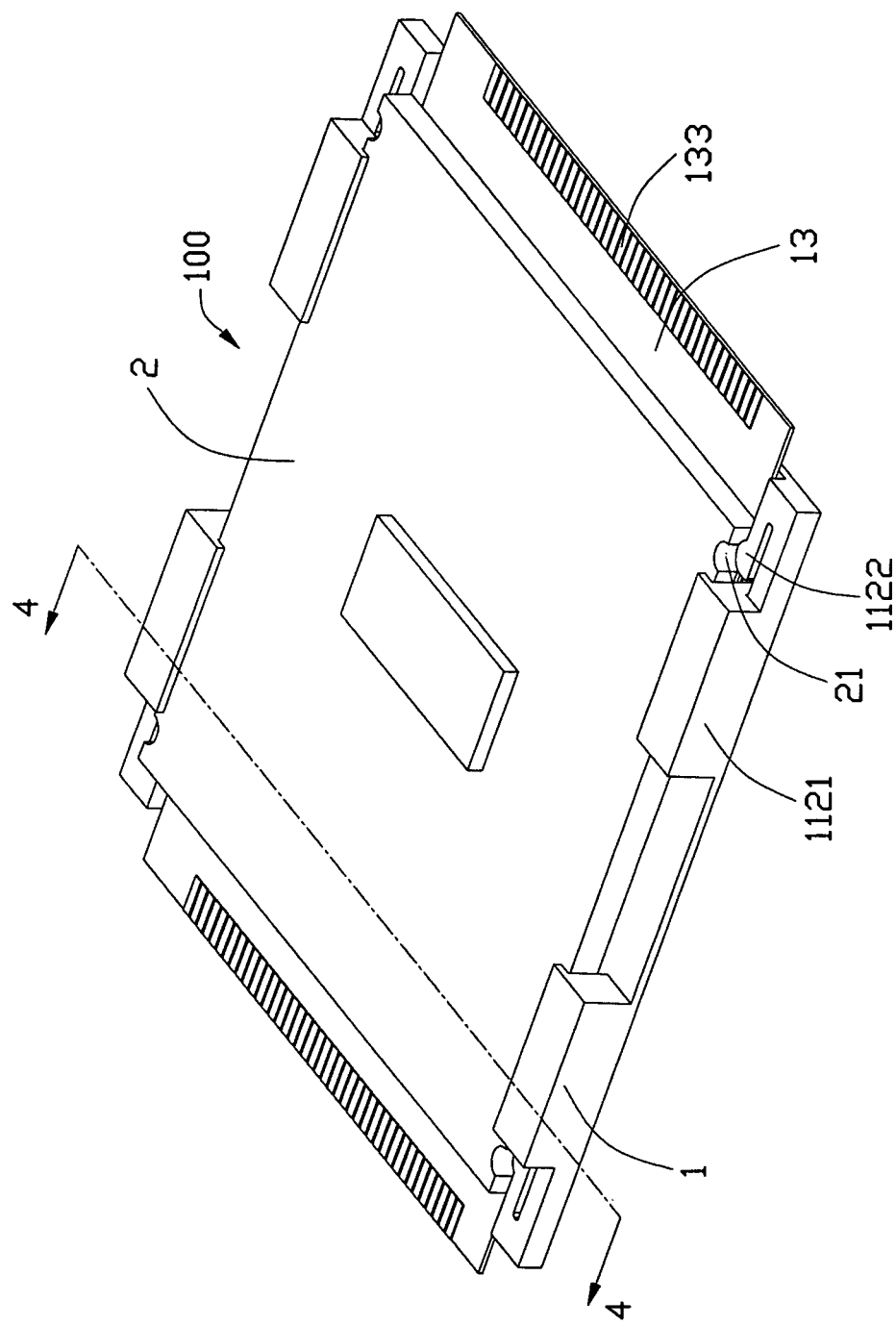
FIG. 1 is an assembled, perspective view of an electrical connector assembly in accordance with a preferred embodiment of the present invention.
Figure 2:
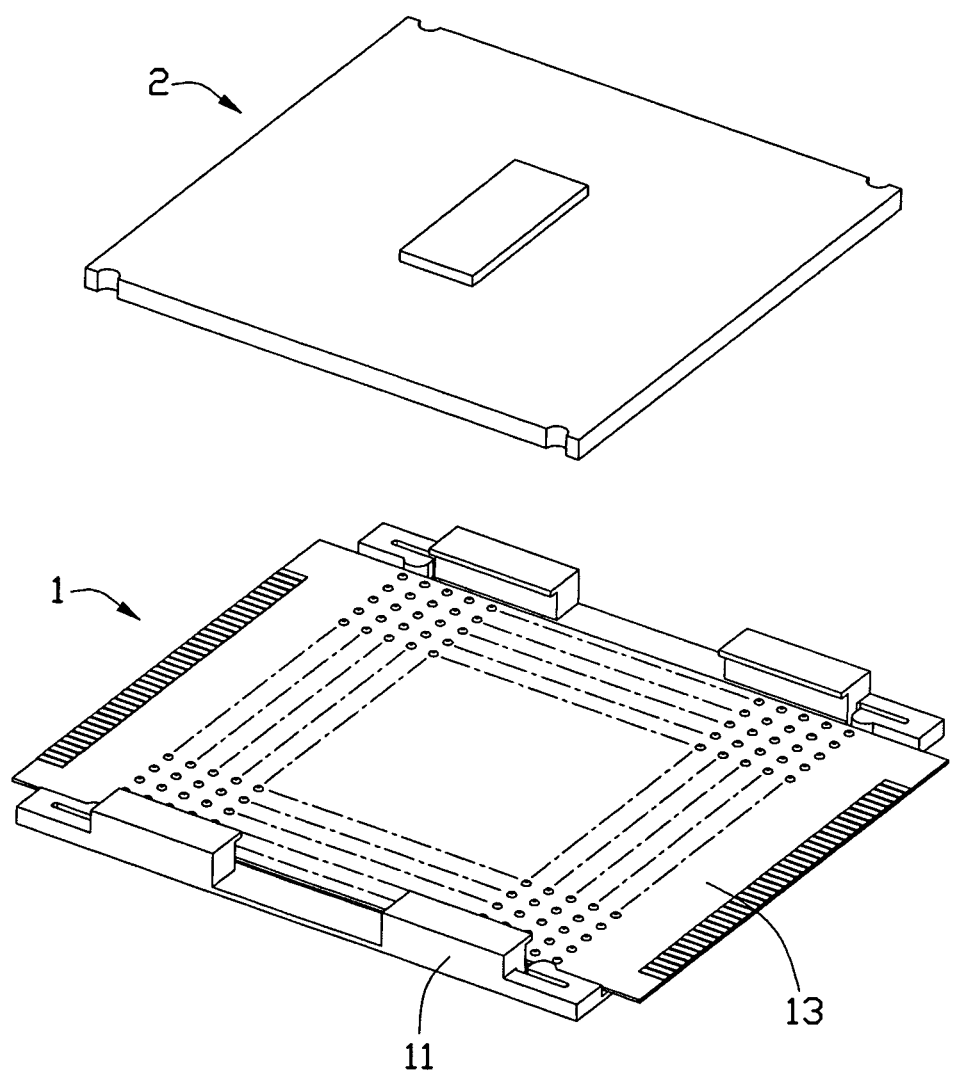
FIG. 2 is a partially exploded, perspective view of the electrical connector assembly shown in FIG. 1, showing the electronic package detached from the electrical connector.
Figure 3:
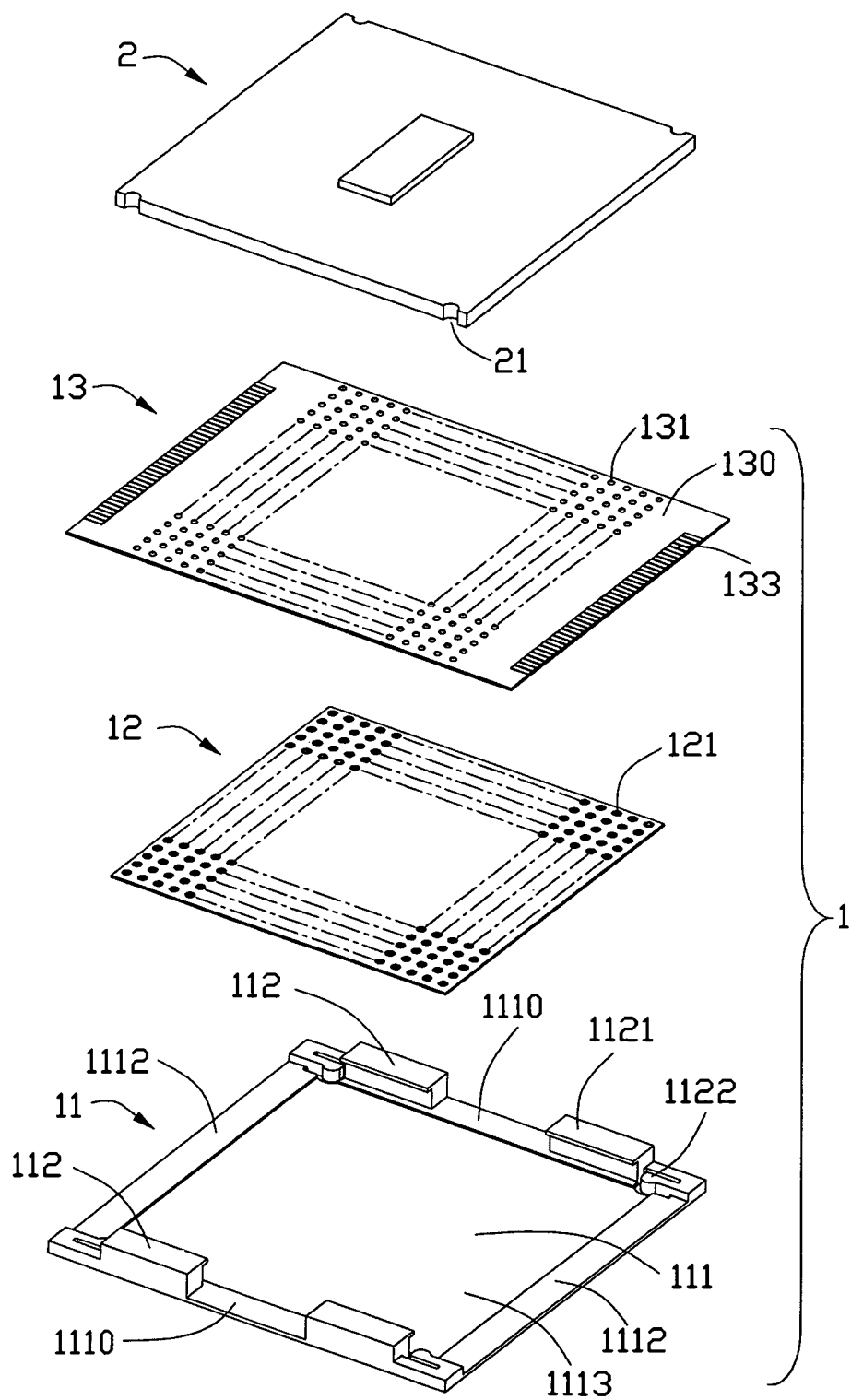
FIG. 3 is an exploded, perspective view of the electrical connector assembly shown in FIG. 1.
Figure 4:
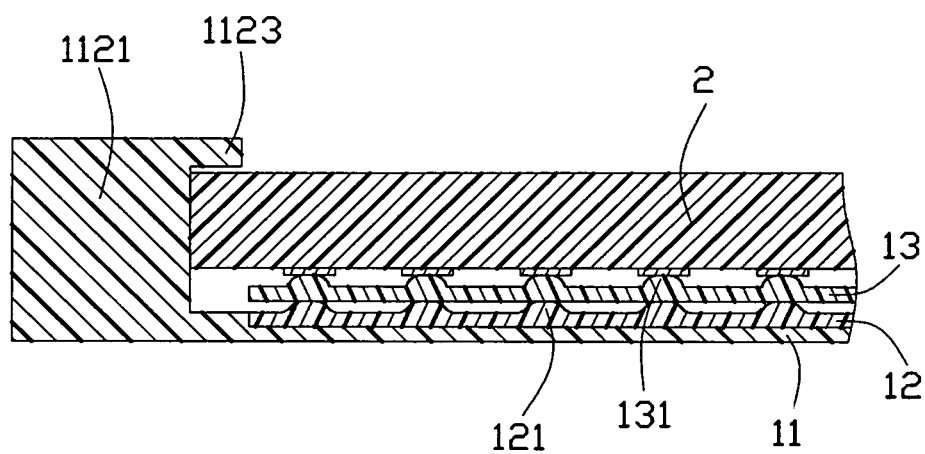
FIG. 4 is a cross-sectional view taken along line 4-4 shown in FIG. 1.

Referring to FIGS. 1 to 4, an electrical connector assembly 100 includes an electrical connector 1 and an electronic package 2 assembled to the electrical connector 1. The electrical connector 1 includes a frame 11 made of an insulative material, a rubber backer 12 received in the frame 11 and a circuit board 13 assembled to the frame 11.

The frame 11 has a flat supporting base 111 with two opposite longitudinal sides 1110 and two opposite transversal sides 1112 adjacent to the longitudinal sides 1110 and four retaining members 112 symmetrically formed at the longitudinal sides 1110 of the supporting base 111 for retaining the electronic package 2. The supporting base 111 defines a trough 1113 in a central position thereof with the rubber backer 12 embedded therein. Each retaining member 112 defines a holding emboss 1121 with a top edge 1123 protruding inwardly and a spring arm 1122 extending along the longitudinal side 1110 of the supporting base 111. The spring arms 1122 extend inwardly from the transversal sides 1112 of the supporting base 111.

The rubber backer 12 is sandwiched between the circuit board 13 and the supporting base 111 and embedded in the trough 1113 of the supporting base 111. The rubber backer 12 defines an array of bumps 121 projecting toward the flat circuit board 13.

The circuit board 13 is laid on the supporting base 111 and fixed to the frame 11 by welding or other method. The circuit board 13 has an array of conductive pads 131 raised on an upper surface 130 thereof for electrically connecting with the electronic package 2 and a plurality of golden fingers 133 aligned in a row on two ends thereof respectively. The ends of the circuit board 13 are beyond the transversal sides 1112 of the supporting base 111, so the golden fingers 133 are exposed from the transversal sides 1112 of the supporting base 111 to electrically connect with an board-side connector (not shown), such as an card edge type connector and so on. The bumps 121 of the rubber backer 12 is arranged corresponding to and supporting the conductive pads 131, thus the rubber backer 12 can apply opposing force and offer compliance to prevent warpage of the electronic package 2. The circuit board 13 has a lower profile than conventional terminals, thereby the electrical connector 1 has lower height.

In an assembly process, the electronic package 2 is slid into the electrical connector 1 from one transversal side 1112 of the supporting base 111 so as to electrically connects with the conductive pads 131. The electronic package 2 is located below the protruding top edge 1123 of the holding emboss 1121 and has cutouts 21 on edges thereof in each of which a distal of each spring arm 1122 held, thereby the package 2 is retained and positioned at predetermined position. The electronic package 2 electrically connects to an external component (not shown) via conductive pads 131 and the golden fingers 133. After the electronic package 2 being assembled in the electrical connector 1, the electrical connector assembly 100 is placed on a circuit substrate (not shown) without welding.

While preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector comprising:
   a frame including a supporting base; and
   a circuit board disposed on the supporting base and including a number of conductive pads arranged in matrix and at least an interface deployed on an edge along a first direction thereof, the length of the circuit board being larger than that of the frame along a second direction that perpendicular to the first direction.

2. The electrical connector as claimed in claim 1, wherein the electrical connector has a rubber backer sandwiched between the circuit board and the supporting base, the rubber backer defining an array of bumps projecting toward the circuit board and corresponding to the conductive pads.

3. The electrical connector as claimed in claim 2, wherein the supporting base defines a trough with the rubber backer embedded therein.

4. The electrical connector as claimed in claim 1, wherein the supporting base defining two opposite longitudinal sides and two opposite transversal sides adjacent to the longitudinal sides, the frame having retaining members formed at the longitudinal sides of the supporting base, each retaining member defining a holding emboss with a top edge protruding inwardly and a spring arm extending along the longitudinal side of the supporting base.

5. The electrical connector as claimed in claim 4, wherein the retaining members are symmetrically formed at the longitudinal sides of the supporting base and the spring arms extend inwardly from the transversal sides of the supporting base.

6. The electrical connector as claimed in claim 1, wherein the interface is a row of golden fingers beyond the frame.

7. An electrical connector assembly comprising:
an electrical connector comprising a circuit board and a frame holding the circuit board, the circuit board having an array of conductive pads on an upper surface thereof and a plurality of golden fingers aligned on at least one end thereof, the frame having a supporting base defining two opposite longitudinal sides and two opposite transversal sides adjacent to the longitudinal sides and retaining members formed at the longitudinal sides of the supporting base, each retaining member defining a holding emboss with a top edge protruding inwardly and a spring arm extending along the longitudinal side of the supporting base; and
an electronic package assembled to the electrical connector and electrically connecting with the conductive pads.

8. The electrical connector assembly as claimed in claim 7, wherein the electrical connector has a rubber backer sandwiched between the circuit board and the frame, the rubber backer defining an array of bumps projecting toward the circuit board and corresponding to the conductive pads.

9. The electrical connector assembly as claimed in claim 8, wherein the supporting base defines a trough with said rubber backer embedded therein.

10. The electrical connector assembly as claimed in claim 7, wherein the end of the circuit board on which the golden fingers located is beyond the transversal side of the supporting base.

11. The electrical connector assembly as claimed in claim 7, wherein the retaining members are symmetrically formed at the longitudinal sides of the supporting base and the spring arms extend inwardly from the transversal sides of the supporting base.

12. The electrical connector assembly as claimed in claim 7, wherein the electronic package is slid into the electrical connector from one transversal side of the supporting base and has cutouts on edges thereof, a distal of each spring arm held in each said cutout.

13. An electrical connector assembly for use with an electrical connector mounted upon a printed circuit board, comprising:
a frame enclosing a circuit substrate, said circuit substrate defining thereon an array of still upwardly facing conductive pads in a vertical direction to couple to an electronic package which is adapted to be retainably received in the frame above the circuit substrate, and further defining an interconnection part around one end edge for coupling to the electrical connector and further establishing an electrical path sequentially from the electronic package, via the circuit substrate and the electrical connector to the printed circuit board; wherein
at least one of the electronic package and the circuit substrate is provided with resilient forces against the other.

14. The electrical connector assembly as claimed in claim 13, further including a rubber backer for urging the circuit substrate against the electronic package.

15. The electrical connector assembly as claimed in claim 13, wherein said frame is equipped with a latch to secure the electronic package in position with regard to the frame.

16. The electrical connector assembly as claimed in claim 13, wherein said frame is configured to only allow the electronic package to be assembled thereto in a horizontal direction perpendicular to said vertical direction.

17. The electrical connector assembly as claimed in claim 13, wherein the circuit substrate is flexible.

18. The electrical connector as claimed in claim 13, wherein the end edge is located outside of the frame in a top view.

19. The electrical connector as claimed in claim 13, wherein said electrical connector is discrete from the frame.

20. The electrical connector as claimed in claim 13, wherein said frame defines a supporting base to upwardly enclose the electronic package thereabove.

* * * * *